(12) United States Patent
Price et al.

(10) Patent No.: US 8,593,811 B2
(45) Date of Patent: Nov. 26, 2013

(54) METHOD AND STRUCTURE FOR OPTIMIZING HEAT EXCHANGER PERFORMANCE

(75) Inventors: Andrew R. Price, Austin, TX (US); Rachid Kaina, Hot Springs, AR (US); Mark C. Garnett, Dallas, TX (US)

(73) Assignee: DunAn Microstaq, Inc., Dallas, TX (US)

( * ) Notice: Subject to any disclaimer, the term of this patent is extended or adjusted under 35 U.S.C. 154(b) by 209 days.

(21) Appl. No.: 13/243,156

(22) Filed: Sep. 23, 2011

(65) Prior Publication Data

US 2012/0140416 A1    Jun. 7, 2012

Related U.S. Application Data

(63) Continuation of application No. PCT/US2010/029629, filed on Apr. 1, 2010.

(60) Provisional application No. 61/166,734, filed on Apr. 5, 2009.

(51) Int. Cl.
*H05K 7/20* (2006.01)
*F28F 27/02* (2006.01)

(52) U.S. Cl.
USPC ..... 361/701; 361/679.53; 361/698; 165/80.4; 165/80.5; 165/104.19; 165/104.22; 251/11; 251/129.01; 251/129.04; 137/14; 137/596.16

(58) Field of Classification Search
USPC ............... 361/679.46–679.53, 688, 689, 698, 361/699, 701–712, 714, 715, 717–724; 165/80.2, 80.4, 80.5, 104.19, 104.22, 165/104.33, 185, 148, 287; 257/712–719; 251/11, 129.01, 129.04, 129.06, 251/129.07, 368, 331; 137/14, 596.12, 137/596.16, 596.17, 625.4, 625.42, 625.44, 137/625.45, 626.46, 828, 831, 833; 29/830, 29/890.03, 890.033, 890.039; 438/201, 438/122, 106, 422, 780, 458; 62/259.2
See application file for complete search history.

(56) References Cited

U.S. PATENT DOCUMENTS 668,202 A    2/1901 Nethery
886,045 A    4/1908 Ehrlich et al.
(Continued)

FOREIGN PATENT DOCUMENTS

CN    101617155 B    3/2012
DE    2215526    10/1973
(Continued)

OTHER PUBLICATIONS

PCT International Search Report, Application No. PCT/US2010/029629 filed Apr. 1, 2010, dated Oct. 28, 2010. AM0029.

(Continued)

*Primary Examiner* — Michail V Datskovskiy
(74) *Attorney, Agent, or Firm* — MacMillan, Sobanski & Todd, LLC

(57) ABSTRACT

A heat exchanger structure including multiple fluid circuits, through which respective streams of a first fluid pass from a stream inlet to a stream outlet to transfer heat to or from a second medium. The fluid circuits are arranged into at least a first group and a second group, at least the first group consisting essentially of only fluid circuits that perform substantially similarly according to at least one selected performance criterion. A control sensor for at least the first group generates a signal representative of a parameter of the first fluid in the associated group. A valve for at least the first group is in fluid communication with of all the streams of the associated group so as to be able to control the flow of fluid through the streams of the associated group in parallel.

8 Claims, 4 Drawing Sheets

(56) References Cited

U.S. PATENT DOCUMENTS

| | | | |
|---|---|---|---|
| 1,886,205 A | 11/1932 | Lyford | |
| 1,926,031 A | 9/1933 | Boynton | |
| 2,412,205 A | 12/1946 | Cook | |
| 2,504,055 A | 4/1950 | Thomas | |
| 2,651,325 A | 9/1953 | Lusignan | |
| 2,840,107 A | 6/1958 | Campbell | |
| 2,875,779 A | 3/1959 | Campbell | |
| 3,031,747 A | 5/1962 | Green | |
| 3,729,807 A | 5/1973 | Fujiwara | |
| 3,747,628 A | 7/1973 | Holster et al. | |
| 3,860,949 A | 1/1975 | Stoeckert et al. | |
| 4,005,454 A | 1/1977 | Froloff et al. | |
| 4,019,388 A | 4/1977 | Hall, II et al. | |
| 4,023,725 A | 5/1977 | Ivett et al. | |
| 4,100,236 A | 7/1978 | Gordon et al. | |
| 4,152,540 A | 5/1979 | Duncan et al. | |
| 4,181,249 A | 1/1980 | Peterson et al. | |
| 4,298,023 A | 11/1981 | McGinnis | |
| 4,341,816 A | 7/1982 | Lauterbach et al. | |
| 4,354,527 A | 10/1982 | McMillan | |
| 4,434,813 A | 3/1984 | Mon | |
| 4,476,893 A | 10/1984 | Schwelm | |
| 4,543,875 A | 10/1985 | Imhof | |
| 4,581,624 A | 4/1986 | O'Connor | |
| 4,593,719 A | 6/1986 | Leonard | |
| 4,628,576 A | 12/1986 | Giachino et al. | |
| 4,647,013 A | 3/1987 | Giachino et al. | |
| 4,661,835 A | 4/1987 | Gademann et al. | |
| 4,687,419 A | 8/1987 | Suzuki et al. | |
| 4,772,935 A | 9/1988 | Lawler et al. | |
| 4,821,997 A | 4/1989 | Zdeblick | |
| 4,824,073 A | 4/1989 | Zdeblick | |
| 4,826,131 A | 5/1989 | Mikkor | |
| 4,828,184 A | 5/1989 | Gardner et al. | |
| 4,869,282 A | 9/1989 | Sittler et al. | |
| 4,938,742 A | 7/1990 | Smits | |
| 4,943,032 A | 7/1990 | Zdeblick | |
| 4,946,350 A | 8/1990 | Suzuki et al. | |
| 4,959,581 A | 9/1990 | Dantlgraber | |
| 4,966,646 A | 10/1990 | Zdeblick | |
| 5,029,805 A | 7/1991 | Albarda et al. | |
| 5,037,778 A | 8/1991 | Stark et al. | |
| 5,050,838 A | 9/1991 | Beatty et al. | |
| 5,054,522 A | 10/1991 | Kowanz et al. | |
| 5,058,856 A | 10/1991 | Gordon et al. | |
| 5,061,914 A | 10/1991 | Busch et al. | |
| 5,064,165 A | 11/1991 | Jerman | |
| 5,065,978 A | 11/1991 | Albarda et al. | |
| 5,066,533 A | 11/1991 | America et al. | |
| 5,069,419 A | 12/1991 | Jerman | |
| 5,074,629 A | 12/1991 | Zdeblick | |
| 5,082,242 A | 1/1992 | Bonne et al. | |
| 5,096,643 A | 3/1992 | Kowanz et al. | |
| 5,116,457 A | 5/1992 | Jerman | |
| 5,131,729 A | 7/1992 | Wetzel | |
| 5,133,379 A | 7/1992 | Jacobsen et al. | |
| 5,142,781 A | 9/1992 | Mettner et al. | |
| 5,161,774 A | 11/1992 | Engelsdorf et al. | |
| 5,169,472 A | 12/1992 | Goebel | |
| 5,176,358 A | 1/1993 | Bonne et al. | |
| 5,177,579 A | 1/1993 | Jerman | |
| 5,178,190 A | 1/1993 | Mettner | |
| 5,179,499 A | 1/1993 | MacDonald et al. | |
| 5,180,623 A | 1/1993 | Ohnstein | |
| 5,197,517 A | 3/1993 | Perera | |
| 5,209,118 A | 5/1993 | Jerman | |
| 5,215,244 A | 6/1993 | Buchholz et al. | |
| 5,216,273 A | 6/1993 | Doering et al. | |
| 5,217,283 A | 6/1993 | Watanabe | |
| 5,222,521 A | 6/1993 | Kihlberg | |
| 5,238,223 A | 8/1993 | Mettner et al. | |
| 5,244,537 A | 9/1993 | Ohnstein | |
| 5,267,589 A | 12/1993 | Watanabe | |
| 5,271,431 A | 12/1993 | Mettner et al. | |
| 5,271,597 A | 12/1993 | Jerman | |
| 5,309,943 A | 5/1994 | Stevenson et al. | |
| 5,323,999 A | 6/1994 | Bonne et al. | |
| 5,325,880 A | 7/1994 | Johnson et al. | |
| 5,333,831 A | 8/1994 | Barth et al. | |
| 5,336,062 A | 8/1994 | Richter | |
| 5,355,712 A | 10/1994 | Petersen et al. | |
| 5,368,704 A | 11/1994 | Madou et al. | |
| 5,375,919 A | 12/1994 | Furuhashi | |
| 5,400,824 A | 3/1995 | Gschwendtner et al. | |
| 5,417,235 A | 5/1995 | Wise et al. | |
| 5,445,185 A | 8/1995 | Watanabe et al. | |
| 5,453,641 A * | 9/1995 | Mundinger et al. | 257/714 |
| 5,458,405 A | 10/1995 | Watanabe | |
| 5,543,349 A | 8/1996 | Kurtz et al. | |
| 5,553,790 A | 9/1996 | Findler et al. | |
| 5,566,703 A | 10/1996 | Watanabe et al. | |
| 5,577,533 A | 11/1996 | Cook, Jr. | |
| 5,589,422 A | 12/1996 | Bhat | |
| 5,611,214 A * | 3/1997 | Wegeng et al. | 62/498 |
| 5,785,295 A * | 7/1998 | Tsai | 251/11 |
| 5,810,325 A | 9/1998 | Carr | |
| 5,838,351 A | 11/1998 | Weber | |
| 5,848,605 A | 12/1998 | Bailey et al. | |
| 5,856,705 A | 1/1999 | Ting | |
| 5,873,385 A | 2/1999 | Bloom et al. | |
| 5,909,078 A | 6/1999 | Wood et al. | |
| 5,926,955 A | 7/1999 | Kober | |
| 5,941,608 A | 8/1999 | Campau et al. | |
| 5,954,079 A | 9/1999 | Barth et al. | |
| 5,955,817 A | 9/1999 | Dhuler et al. | |
| 5,963,788 A * | 10/1999 | Barron et al. | 438/48 |
| 5,970,998 A | 10/1999 | Talbot et al. | |
| 5,994,816 A | 11/1999 | Dhuler et al. | |
| 6,019,437 A | 2/2000 | Barron et al. | |
| 6,023,121 A | 2/2000 | Dhuler et al. | |
| 6,038,928 A | 3/2000 | Maluf et al. | |
| 6,041,650 A | 3/2000 | Swindler et al. | |
| 6,096,149 A | 8/2000 | Hetrick et al. | |
| 6,105,737 A | 8/2000 | Weigert et al. | |
| 6,114,794 A | 9/2000 | Dhuler et al. | |
| 6,116,863 A | 9/2000 | Ahn et al. | |
| 6,123,316 A | 9/2000 | Biegelsen et al. | |
| 6,124,663 A | 9/2000 | Haake et al. | |
| 6,171,972 B1 | 1/2001 | Mehregany et al. | |
| 6,182,742 B1 | 2/2001 | Takahashi et al. | |
| 6,224,445 B1 | 5/2001 | Neukermans et al. | |
| 6,230,408 B1 * | 5/2001 | Ehrfeld et al. | 29/890.039 |
| 6,255,757 B1 | 7/2001 | Dhuler et al. | |
| 6,279,606 B1 | 8/2001 | Hunnicutt et al. | |
| 6,283,441 B1 | 9/2001 | Tian | |
| 6,381,846 B2 * | 5/2002 | Insley et al. | 29/890.039 |
| 6,382,588 B1 * | 5/2002 | Hierold | 251/129.04 |
| 6,386,507 B2 | 5/2002 | Dhuler et al. | |
| 6,390,782 B1 | 5/2002 | Booth et al. | |
| 6,408,876 B1 | 6/2002 | Nishimura et al. | |
| 6,447,727 B1 * | 9/2002 | Parce et al. | 422/504 |
| 6,457,515 B1 * | 10/2002 | Vafai et al. | 165/80.4 |
| 6,494,804 B1 | 12/2002 | Hunnicutt et al. | |
| 6,505,811 B1 | 1/2003 | Barron et al. | |
| 6,520,197 B2 | 2/2003 | Deshmukh et al. | |
| 6,523,560 B1 * | 2/2003 | Williams et al. | 137/14 |
| 6,533,366 B1 | 3/2003 | Barron et al. | |
| 6,540,203 B1 | 4/2003 | Hunnicutt | |
| 6,581,640 B1 * | 6/2003 | Barron | 137/833 |
| 6,629,425 B2 * | 10/2003 | Vaiyapuri | 62/259.2 |
| 6,637,722 B2 | 10/2003 | Hunnicutt | |
| 6,662,581 B2 | 12/2003 | Hirota et al. | |
| 6,694,998 B1 | 2/2004 | Hunnicutt | |
| 6,724,718 B1 | 4/2004 | Shinohara et al. | |
| 6,755,761 B2 | 6/2004 | Hunnicutt et al. | |
| 6,761,420 B2 | 7/2004 | Maluf et al. | |
| 6,785,134 B2 * | 8/2004 | Maveety et al. | 361/699 |
| 6,825,557 B2 * | 11/2004 | DiBattista et al. | 257/712 |
| 6,845,962 B1 | 1/2005 | Barron et al. | |
| 6,872,902 B2 | 3/2005 | Cohn et al. | |
| 6,902,988 B2 | 6/2005 | Barge et al. | |
| 6,958,255 B2 | 10/2005 | Khuri-Yakub et al. | |
| 6,966,329 B2 | 11/2005 | Liberfarb | |
| 6,981,849 B2 * | 1/2006 | Kim et al. | 417/50 |

(56) References Cited

U.S. PATENT DOCUMENTS

| | | | |
|---|---|---|---|
| 7,011,378 B2* | 3/2006 | Maluf et al. | 303/119.2 |
| 7,063,100 B2 | 6/2006 | Liberfarb | |
| 7,104,312 B2* | 9/2006 | Goodson et al. | 165/80.4 |
| 7,204,298 B2* | 4/2007 | Hodes et al. | 165/80.4 |
| 7,210,502 B2 | 5/2007 | Fuller et al. | |
| 7,258,774 B2* | 8/2007 | Chou et al. | 204/450 |
| 7,372,074 B2 | 5/2008 | Milne et al. | |
| 7,414,843 B2* | 8/2008 | Joshi et al. | 361/699 |
| 7,449,413 B1 | 11/2008 | Achuthan et al. | |
| 7,460,369 B1* | 12/2008 | Blish, II | 361/699 |
| 7,608,160 B2* | 10/2009 | Zhou et al. | 156/272.2 |
| 7,652,372 B2* | 1/2010 | Dishongh et al. | 257/714 |
| 7,823,403 B2* | 11/2010 | Sapir | 62/259.2 |
| 7,872,349 B2* | 1/2011 | Lehmann et al. | 257/714 |
| 8,113,448 B2 | 2/2012 | Keating | |
| 8,113,482 B2 | 2/2012 | Hunnicutt | |
| 8,156,962 B2 | 4/2012 | Luckevich | |
| 2002/0014106 A1 | 2/2002 | Srinivasan et al. | |
| 2002/0029814 A1 | 3/2002 | Unger et al. | |
| 2002/0096421 A1 | 7/2002 | Cohn et al. | |
| 2002/0160561 A1* | 10/2002 | Ouellet et al. | 438/201 |
| 2002/0174891 A1 | 11/2002 | Maluf et al. | |
| 2002/0176804 A1* | 11/2002 | Strand et al. | 422/100 |
| 2003/0061889 A1 | 4/2003 | Tadigadapa et al. | |
| 2003/0098612 A1 | 5/2003 | Maluf et al. | |
| 2003/0159811 A1 | 8/2003 | Nurmi | |
| 2003/0206832 A1 | 11/2003 | Thiebaud et al. | |
| 2003/0231967 A1* | 12/2003 | Najafi et al. | 417/322 |
| 2004/0089357 A1* | 5/2004 | Dube et al. | 137/884 |
| 2004/0113265 A1* | 6/2004 | DiBattista et al. | 257/714 |
| 2004/0115905 A1 | 6/2004 | Barge et al. | |
| 2005/0121090 A1 | 6/2005 | Hunnicutt | |
| 2005/0200001 A1 | 9/2005 | Joshi et al. | |
| 2005/0205136 A1 | 9/2005 | Freeman | |
| 2006/0017125 A1 | 1/2006 | Lee et al. | |
| 2006/0067649 A1 | 3/2006 | Tung et al. | |
| 2006/0078470 A1* | 4/2006 | Zhou et al. | 422/100 |
| 2006/0218953 A1 | 10/2006 | Hirota | |
| 2007/0251586 A1 | 11/2007 | Fuller et al. | |
| 2007/0289941 A1 | 12/2007 | Davies | |
| 2008/0072977 A1 | 3/2008 | George et al. | |
| 2008/0271788 A1 | 11/2008 | Matsuzaki et al. | |
| 2009/0123300 A1 | 5/2009 | Uibel | |
| 2009/0186466 A1 | 7/2009 | Brewer | |
| 2010/0019177 A1 | 1/2010 | Luckevich | |
| 2010/0038576 A1 | 2/2010 | Hunnicutt | |
| 2010/0225708 A1 | 9/2010 | Peng et al. | |
| 2010/0251742 A1 | 10/2010 | Tucker et al. | |
| 2012/0000550 A1 | 1/2012 | Hunnicutt | |

FOREIGN PATENT DOCUMENTS

| | | |
|---|---|---|
| DE | 2930779 | 2/1980 |
| DE | 3401404 | 7/1985 |
| DE | 4101575 | 7/1992 |
| DE | 4417251 | 11/1995 |
| DE | 4422942 | 1/1996 |
| EP | 250948 | 1/1988 |
| EP | 261972 | 3/1988 |
| EP | 1024285 | 8/2000 |
| GB | 2238267 | 5/1991 |
| JP | Sho 39-990 | 2/1964 |
| JP | 04-000003 | 1/1992 |
| JP | 06-117414 | 4/1994 |
| JP | 2001184125 | 7/2001 |
| JP | 2003-049933 | 2/2003 |
| JP | Sho 63-148062 | 7/2003 |
| JP | 2006-080194 | 3/2006 |
| WO | 99/16096 A1 | 4/1999 |
| WO | 99/24783 A1 | 5/1999 |
| WO | 00/14415 A2 | 3/2000 |
| WO | 00/14415 A3 | 7/2000 |
| WO | 2005/084211 A2 | 9/2005 |
| WO | 2005/084211 A3 | 1/2006 |
| WO | 2006/076386 A1 | 7/2006 |
| WO | 2008/076388 A1 | 6/2008 |
| WO | 2008/076388 B1 | 8/2008 |
| WO | 2008/121365 A1 | 10/2008 |
| WO | 2008/121369 A1 | 10/2008 |
| WO | 2009/076623 A1 | 6/2009 |
| WO | 2009/076628 A3 | 6/2009 |
| WO | 2010/019329 A2 | 2/2010 |
| WO | 2010/019329 A3 | 2/2010 |
| WO | 2010/019665 A2 | 2/2010 |
| WO | 2010/019665 A3 | 2/2010 |
| WO | 2010/065804 A2 | 6/2010 |
| WO | 2010/065804 A3 | 6/2010 |
| WO | 2011/022267 A2 | 2/2011 |
| WO | 2011/022267 A3 | 2/2011 |
| WO | 2011/094300 A2 | 8/2011 |
| WO | 2011/094300 A3 | 8/2011 |
| WO | 2011/094302 A2 | 8/2011 |
| WO | 2011/094302 A3 | 8/2011 |

OTHER PUBLICATIONS

Unpublished U.S. Appl. No. 09/309,316, incorporated by reference at col. 4, Line 30, of U.S. Patent No. 6,520,197, which Patent has prior publication as U.S. Patent Application Publication No. US 2001/0055242A1, published Dec. 27, 2001 (whic.

Ayon et al., "Etching Characteristics and Profile Control in a Time Multiplexed ICP Etcher," Proc. of Solid State Sensor and Actuator Workshop Technical Digest, Hilton Head SC, (Jun. 1998) 41-44.

Bartha et al., "Low Temperature Etching of Si in High Density Plasma Using SF6/02," Microelectronic Engineering, and Actuator Workshop Technical Digest, Hilton Head SC, (Jun. 1998) 41-44.

Booth, Steve and Kaina, Rachid, Fluid Handling—Big Gains from Tiny Valve, Appliance Design (Apr. 2008), pp. 46-48.

Controls Overview for Microstaq Silicon Expansion Valve (SEV), Rev. 1, Dec. 2008 [online], [retrieved May 17, 2010]. Retrieved from the Internet <URL: http://www.microstaq.com/pdf/SEV_controls.pdf>.

Copeland, Michael V., Electronic valves promise big energy savings, Fortune, Sep. 9, 2008 [online], [retrieved Sep. 9, 2008]. Retrieved from the internet <URL: http://techland.blogs.fortune.cnn.com/2008/09/09/electronic-valves-promise-big-energy-savings>.

Fung et al., "Deep Etching of Silicon Using Plasma" Proc. of the Workshop on Micromachining and Micropackaging of Transducers, (Nov. 7-8, 1984) pp. 159-164.

Gui, C. et al, "Selective Wafer Bonding by Surface Roughness Control", Journal of the Electrochemical Society, 148 (4) G225-G228 (2001).

Gui, C. et al., "Fusion bonding of rough surfaces with polishing technique for silicon micromachining", Microsystem Technologies (1997) 122-128.

Günther, Götz, "Entwicklung eines pneumatischen 3/2-Wege-Mikroventils", O + P Olhydraulik Und Pneumatik, Vereinigte Fachverlage, Mainz, DE, vol. 42, No. 6, Jun. 1, 1998, pp. 396-398, XP000831050, ISSN: 0341-2660.

Higginbotham, Stacey, Microstaq's Tiny Valves Mean Big Energy Savings [online], [retrieved Dec. 8, 2008]. Retrieved from the Internet <URL: http//earth2tech.com/2008/09/09/microstaqs-tiny-valves-mean-big-energy savings (posted Sep. 9, 2008)>.

J. Mark Noworolski, et al.,"Process for in-plane and out-of-plane single-crystal-silicon thermal microactuators", Sensors and Actuators A 55 (1996); pp. 65-69.

Jonsmann et al., "Compliant Electra-thermal Microactuators", IEEE Technical Digest, Twelfth IEEE International Conference on Micro Electro Mechanical Systems Jan. 17-21, 1999, Orlando, Florida, pp. 588-593, IEEE Catalog No. 99CH36291C.

K.R. Williams et al., "A Silicon Microvalve for the Proportional Control of Fluids", Transducers '99, Proc. 10th International Conference on Solid State Sensors and Actuators, held Jun. 7-10, 1999, Sendai, Japan, pp. 18-21.

Keefe, Bob, Texas firm says value-replacing chip can drastically cut energy use, Atlanta Metro News, Sep. 10, 2008 [online], [retrieved

(56) References Cited

OTHER PUBLICATIONS

Sep. 10, 2008]. Retrieved from the Internet <URL: http://www.ajc.com/search/content/shared/money/stories/2008/09/microstaq10_cox-F9782.html>.

Klaassen et al., "Silicon Fusion Bonding and Deep Reactive Ion Etching; A New Technology for Microstructures," Proc., Transducers 95 Stockholm Sweden, (1995) 556-559.

Linder et al., "Deep Dry Etching Techniques as a New IC Compatible Tool for Silicon Micromachining," Proc, Transducers, vol. 91, (Jun. 1991) pp. 524-527.

Luckevich, Mark, MEMS microvlaves: the new valve world, Valve World (May 2007), pp. 79-83.

MEMS, Microfluidics and Microsystems Executive Review [online], Posted Apr. 16, 2009. [retrieved May 17, 2010]. Retrieved from the Internet <URL: http:www.memsinvestorjournal.com/2009/04/mems-applications-for-flow-control-.html>.

Microstaq Announces High Volume Production of MEMS-Based Silicon Expansion Valve [onlne], [retrieved Jan. 27, 2010]. Retrieved from the Internet <URL: http://www.earthtimes.org/articles/printpressstory.php?news+1138955 (posted Jan. 27, 2010)>.

Microstaq Product Descriptions, SEV, CPS-4, and PDA-3 [online], Published 2009, [retrieved May 17, 2010]. Retrieved from the Internet <URL: http://www.microstaq.com/products/index.html>.

Microstaq Product Description, Proportional Direct Acting Silicon Control Valve (PDA-3) [online], Published 2008, [retrieved May 17, 2010]. Retrieved from the Internet <URL: http://www.microstaq.com/products/pda3.html>.

Microstaq Product Description, Proportional Piloted Silicon Control Valve (CPS-4) [online], Published 2008, [retrieved May 17, 2010]. Retrieved from the Internet <URL: http://www.microstaq.com/products/cps4.html>.

Microstaq Technology Page [online], Published 2008, [retrieved May 17, 2010]. Retrieved from the Internet <URL: http://www.microstaq.com/technology/index.html>.

Petersen et al. "Surfaced Micromachined Structures Fabricated with Silicon Fusion Bonding" Proc., Transducers 91, (Jun. 1992) pp. 397-399.

Press Release, Freescale and Microstaq Join Forces on Smart Superheat Control System for HVAC and Refrigeration Efficiency (posted Jan. 22, 2008) [online], [retrieved May 17, 2010]. Retrieved from the Internet <URL: http://www.microstaq.com/pressReleases/prDetail_04.html>.

Press Release, Microstaq Unveils Revolutionary Silicon Expansion Valve at Demo 2008 [online], [retrieved May 17, 2010]. Retrieved from the Internet <URL: http://www.microstaq.com/pressReleases/prDetail_05.html (posted Sep. 8, 2008)>.

Press Release, Microstaq Mastering Electronic Controls for Fluid-Control Industry (posted May 5, 2005) [online[, [retrieved May 17, 2010]. Retrieved from the Internet <URL: http://www.microstaq.com/pressReleases/prDetail_02.html>.

Press Release, Nanotechnology Partnerships, Connections Spur Innovation for Fluid Control Industries (posted Jun. 9, 2005) [online], [retrieved May 17, 2010]. Retrieved from the Internet <URL: http://www.microstaq.com/pressReleases/prDetail_03.html>.

Product Review, greentechZONE Products for the week of May 18, 2009 [online], [retrieved May 17, 2010]. Retrieved from the Internet <URL: http://www.en-genius.net/site/zones/greentechZONE/product_reviews/grnp_051809>.

SEV Installation Instructions [online], [retrieved May 17, 2010]. Retrieved from the Internet <URL: http://www.microstaq.com/pdf/SEV_Instruction_sheet.pdf>.

Silicon Expansion Valve Information Sheet [online], [retrieved May 17, 2010]. Retrieved from the Internet <URL: http://www.microstaq.com/pdf/SEV_Infosheet_2_0.pdf>.

Silicon Expansion Valve (SEV)—For Heating, Cooling, and Refrigeration Applications [online], [retrieved May 17, 2010]. Retrieved from the Internet <URL: http://www.microstaq.com/pdf/SEV_Quicksheet.pdf>.

Silicon Expansion Valve Data Sheet [online], [retrieved May 17, 2010]. Retrieved from the Internet <URL: http://www.microstaq.com/pdf/SEV_Datasheet_1_8.pdf>.

SMIC Announces Successful Qualification of a MEMS Chip for Microstaq (posted Oct. 26, 2009) [online], [retrieved May 17, 2010]. Retrieved from the Internet <URL: http://www.prnewswire.com/news-releases/smic-announces-successful-qualification-of-a-mems-chip-for-microstaq-65968252.html (posted Oct. 26, 2009)>.

SMIC quals Microstaq MEMS chip for fluid control (posted Oct. 26, 2009) [online], [retrieved May 17, 2010]. Retrieved from the Internet <URL: http://www.electroiq.com/ElectroiQ/en-us/index/display/Nanotech_Article_Tools_Template.articles.small-times.nanotechmems.mems.microfluidics.2009.10.smic-quals_microstaq.html>.

Tiny Silicon Chip Developed by Microstaq Will Revolutionize Car Technology (posted May 19, 2005) [online], [retrieved May 19, 2005]. Retrieved from the Internet <URL: http://www.nsti.org/press/PRshow.html?id=160>.

Turpin, Joanna R., Soft Economy, Energy Prices Spur Interest in Technologies [online], Published Dec. 8, 2008. [retrieved May 18, 2010]. Retrieved from the Internet <URL: http://www.achrnews.com/copyright/BNP_GUID_9-5-2006_A_10000000000000483182>.

Uibel, Jeff, The Miniaturization of Flow Control (Article prepared for the 9th International Symposium on Fluid Control Measurement and Visualization (FLUCOME 2007)), Journal of Visualization (vol. 11, No. 1, 2008), IOS Press.

Yunkin et al., "Highly Anisotropic Selective Reactive Ion Etching of Deep Trenches in Silicon," Microelectronic Engineering, Elsevier Science B.V., vol. 23, (1994) pp. 373-376.

Zhixiong Liu et al., "Micromechanism fabrication using silicon fusion bonding", Robotics and Computer Integrated Manufacturing 17 (2001) 131-137.

W.V. Payne and P.A.Domanski,"Potential Benefits of Smart Refrigerant Distributors",Jan. 2003, Air-Conditioning and Refrigeration Technology Institute.

Biography, Ohio State University Website [online], [retrieved Dec. 31, 2000]. Retrieved from the Internet <URL: http://www.chemistry.ohio-state.edu/resource/pubs/brochure/madou.htm>.

Madou, Marc, "Fundamentals of Microfabrication", Boca Raton: CRC Press, 1997, 405-406.

* cited by examiner

METHOD AND STRUCTURE FOR OPTIMIZING HEAT EXCHANGER PERFORMANCE

BACKGROUND OF INVENTION

The present invention is generally directed to an apparatus and method for optimizing performance of multi-circuit heat exchangers. As used herein, "heat exchanger" means a device built for relatively efficient heat transfer between a first medium and a second medium, the first medium being a fluid constrained in a conduit having a wall, the second medium being a fluid or a non-fluid, and if the second medium is a fluid, then the first medium and the second medium are separated by at least the conduit wall so that the first medium and the second medium do not come into contact with one another. A "multi-circuit" heat exchanger, as used herein, means a single heat exchanger having multiple fluid conduits (circuits) into which a flow of a fluid is subdivided while flowing from one common point to another common point, heat from another medium of the heat exchanger being transferred to or from the fluid while the fluid passes through the multiple fluid conduits.

Heat exchangers are used in a variety of applications. A very abbreviated list of some of the ways in which heat exchangers are used includes transferring heat from semiconductors to a cooling fluid, transferring heat in heating, ventilation, air conditioning, and/or refrigeration systems ("HVACR systems") as part of a process to warm or cool a location, and transferring heat in industrial processes such as those used in electrical power plants, chemical plants and oil refineries.

For example, a typical function of one type of HVACR system is to heat or cool air to a more comfortable temperature by manipulating the transfer of heat. In particular, an air conditioning system may contain a cooling coil that absorbs heat from hot air to lower the air's temperature. Similarly, a heating system may utilize a heated gas or liquid to transfer heat to cold air to increase the air's temperature.

Heat transfer from or to a medium may be effected within such HVAC systems by the use of a working fluid or refrigerant, such as ammonia, R134a (tetrafluoroethane), or similar fluids. These working fluids are generally capable of changing state under various conditions of temperature and pressure. With each change of state, the working fluid either accepts energy or gives up energy. As a result, this energy is either removed or added to the medium, respectively, so that a cold medium may be heated or a hot medium may be cooled.

In the following example, the working fluid is a first fluid and the medium to be cooled is air, a second fluid. A heat exchanger is utilized to transfer heat between the first and second fluids while preventing intermixing of the two fluids.

In a conventional air conditioning system, the working fluid generally moves in the following cycle of operation: (1) from a compressor; (2) to a condenser; (3) through an expansion valve; (4) to an evaporator; and then (5) back to the compressor. As an example of a typical air conditioning system, the working fluid enters the compressor as a low temperature gas at about 65 degrees F. and leaves the compressor as a high temperature gas at about 150 degrees F. The working fluid then enters the condenser. Within the condenser, which is a heat exchanger, the working fluid thermally communicates with, and gives up heat to without intermixing with, surrounding cooler air or other cooler medium, and the working fluid is converted from a high temperature gas into a cooler liquid of about 90 degrees F. The working fluid then passes through an expansion valve to a region of low pressure. As a result, the working fluid begins to change state from a liquid to a low temperature gas of about 45 degrees F. The working fluid then flows through the evaporator, which is another heat exchanger, where the working fluid thermally communicates with, and absorbs heat from without intermixing with, the hot second fluid (air) flowing through another part of the evaporator. As heat is transferred from the hot second fluid to the working fluid, the hot second fluid is cooled, and the working fluid is heated to become a gas of about 65 degrees F., ready for return to the compressor. When the second fluid is a gas, such as the air in this example, the second fluid may be dehumidified as part of this process.

According to one aspect of the invention, this invention relates to a method for optimizing performance of a heat exchanger having multiple fluid circuits through which respective streams of a first fluid pass from a stream inlet to a stream outlet to transfer heat to or from a second medium. The method includes, as a first step, dividing the fluid circuits into at least two groups by identifying at least one group of the fluid circuits that perform similarly according to at least one selected performance criterion. A second step includes providing a respective valve for at least the identified group, which valve is in fluid communication with of all the streams of the associated group so as to be able to control the flow of fluid through the streams of the associated group in parallel. A third step, which may be performed before the second step, includes providing a respective sensor for at least the identified group, which sensor generates a signal representative of a parameter of the first fluid in the associated group. A fourth step includes operating each respective valve based at least in part upon the signal generated by the associated control sensor to separately control the flow of the first fluid though the associated group. According to another aspect, the invention also relates to a heat exchanger structure optimized by this method.

Various objects and advantages of this invention will become apparent to those skilled in the art from the following detailed description of the preferred embodiment, when read in light of the accompanying drawings.

DETAILED DESCRIPTION

Figure 1:
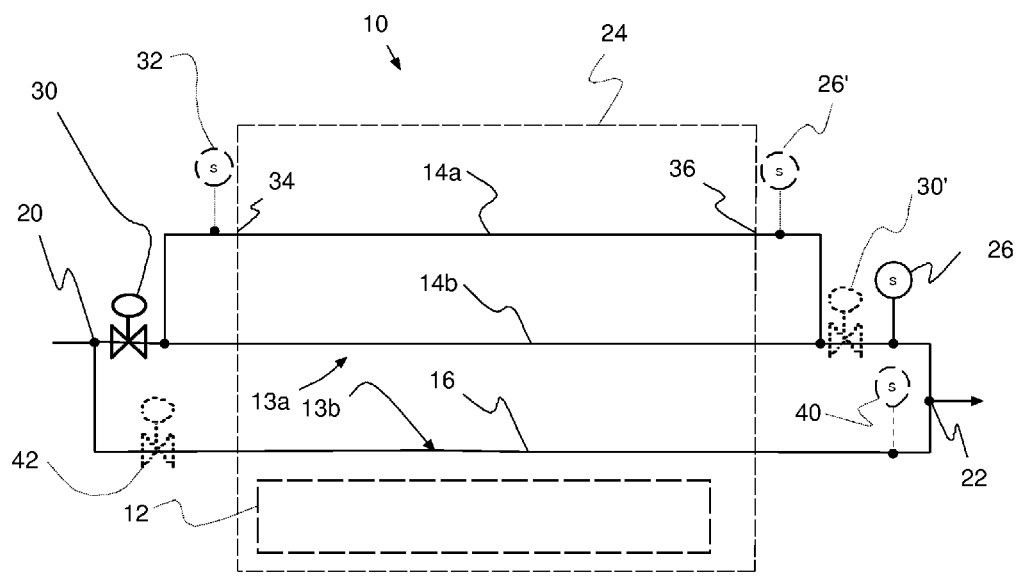
FIG. 1 is a schematic illustration of a first embodiment of a heat exchanger.

Referring now to the drawings, there is illustrated in FIG. 1 a heat exchanger, indicated generally at 10. The heat exchanger 10 may provide for relatively efficient heat transfer from one medium to another medium. In the illustrated embodiment, one medium is indicated at 12, while the other medium, a first fluid, may be contained within three fluid conduits 14a, 14b, 16. The medium 12 does not mix with the first fluid, as the first fluid is contained by the solid walls defining the fluid conduits 14a, 14b, and 16. The medium 12 may be a fluid or a non-fluid.

The heat exchanger 10 may be any suitable type of heat exchanger, including, but not limited to a fin-and-tube heat exchanger, a shell and tube heat exchanger, a microchannel heat exchanger, a micromachined heat exchanger, and a plate heat exchanger. The heat exchanger 10 may even consist of an arrangement in which the fluid conduits 14a, 14b, and 16 are formed as passageways within a solid body, which body either forms a part of the medium 12, or is a body to which the medium 12 is connected for heat transfer. In this example, the medium 12 might be, for example, a portion of a solid state electronics device, which is to be cooled by circulating the first fluid through the fluid conduits 14a, 14b, and 16.

Beyond that, the heat exchanger 10 is a multi-circuit heat exchanger in that the flow of the first fluid through the heat exchanger 10 is subdivided into respective streams flowing through an associated one of the multiple fluid conduits 14a, 14b, and 16 after flowing from a first common point 20. The streams of the first fluid rejoin one another as the fluid conduits 14a, 14b, and 16 are connected in communication with a second common point 22 at the outlet of the heat exchanger 10. Within a general heat exchange area, indicated by a dashed line 24, substantially all of the heat transfer between the medium 12 and the first fluid contained in the multiple fluid conduits 14a, 14b, and 16 occurs.

A sensor 26 may be provided in a location to sense a parameter of the combined streams of the fluid conduits 14a and 14b. A valve 30 may be provided to control the flow of the first fluid through associated fluid streams; in this case, through the fluid conduits 14a and 14b. The valve 30 may be operated based at least in part upon a signal generated by the sensor 26 indicative of the value of the sensed parameter of the first fluid.

The fluid conduits 14a, 14b, and 16 are divided into two groups, a first group, indicated generally at 13a, consisting of the fluid conduits 14a and 14b, and a second group, indicated generally at 13b, consisting of the fluid conduit 16. The fluid conduits 14a and 14b may be determined to perform similarly within the heat exchanger 10 according to a selected performance criterion or selected criteria. The fluid conduit 16 may be determined to perform differently than the fluid conduits 14a and 14b according to the selected performance criterion. The determination of similar performance may be made predictively, based upon the design of the heat exchanger 10 and anticipated operating conditions, or may be made based upon actual measurements of the heat exchanger 10 during actual operating conditions, or a combination of actual measurements and prediction.

Any suitable performance related parameter or combination of parameters may be utilized as criteria to determine similarity of performance of fluid conduits carrying the first fluid, including (without limitation) such parameters as:

degrees of superheat of the first fluid at the respective stream outlet;
temperature of the first fluid at the respective stream outlet;
temperature of the first fluid intermediate the respective stream inlet and stream outlet;
temperature change between the respective stream inlet and stream outlet;
temperature change between the respective stream inlet and a point intermediate the respective stream inlet and stream outlet;
mass flow rate of the first fluid through the respective stream;
volumetric flow rate of the first fluid through the respective stream;
heat transfer rate between the first fluid in the respective stream and the second fluid;
relative energy content of the first fluid at the stream outlet;
pressure change between the respective stream inlet and stream outlet; and
pressure change between the respective stream inlet and a point intermediate the respective stream inlet and stream outlet.

Similarly, any suitable parameter or combination of parameters may be monitored and utilized as an input for control of the valve 30, including the parameters indicated in the preceding paragraph as being performance related parameters that may be utilized as criteria to determine similarity of performance of fluid conduits carrying the first fluid. It will be appreciated that some of these parameters may require additional sensors. For example, pressure drop between the respective stream inlet and stream outlet may be calculated from a pressure reading from a pressure sensor, indicated in phantom at 32, at a stream inlet 34 for the conduit 14a and a pressure reading from the pressure sensor 26' at a stream outlet 36 for the conduit 14a, as illustrated in FIG. 1.

Note that, because the conduits 14a and 14b have been determined to perform similarly, it is contemplated that the sensor 26, sensing the combined streams of the conduits 14a or 14b, might be replaced by a sensor, indicated at 26', sensing only the parameter of the stream of the first fluid through one of the conduits 14a (as shown in dashed lines in FIG. 1) or 14b.

During operation of the heat exchanger 10, heat may be transferred between the medium 12 and the stream of the first fluid contained in the fluid conduit 16 according to the laws of heat transfer, and the performance of the fluid conduit 16 may vary as conditions (such as the flow rate, density, or temperature of the first fluid, or temperature of the second medium) change. As illustrated in FIG. 1, the fluid conduit 16 is not provided with a valve to control flow therethrough, and thus, as conditions vary, the performance of the fluid conduit 16 may also vary. It may be desirable to at least partially control operation of the system in which the heat exchanger 10 is installed to optimize the performance of the fluid conduit 16 under changing conditions, for example, by changing the operation of a pump (not shown) or a compressor (not shown), a flow restrictor (not shown), or a valve (not shown) supplying the first fluid to the first common point 20, or by installing a flow restrictor in the fluid conduit 16. Or, it may be desirable to provide the fluid conduit 16 with a respective sensor (indicated in phantom at 40) and valve (indicated in phantom at 42) to allow adjustment of the performance of the fluid conduit 16 as conditions change. However the performance of the fluid conduit 16 varies as conditions change, the performance of the fluid conduits 14a and 14b may differ from the fluid conduit 16. Accordingly, the valve 30 may be operated to control flow of the first fluid through, simultaneously, the mutually similarly performing fluid conduits 14a and 14b, to optimize the performance of the fluid conduits 14a and 14b as conditions change, as indicated by the sensor 26.

Figure 2:
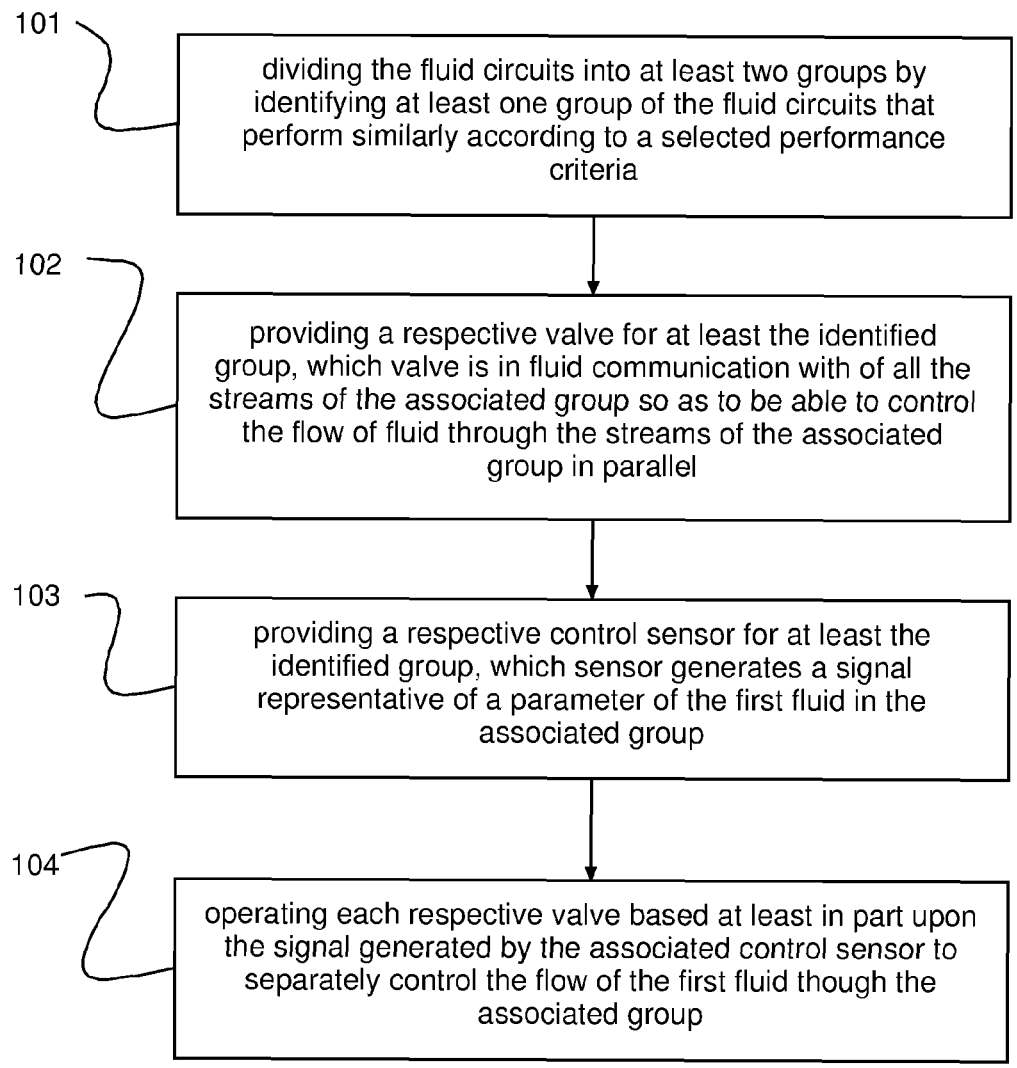
FIG. 2 is a flow chart illustrating a method of optimizing performance of a heat exchanger.

FIG. 2 illustrates one possible method for providing optimized performance for a heat exchanger such as the heat exchanger 10 illustrated in FIG. 1, having multiple fluid circuits 14a, 14b, and 16 through which respective streams of the first fluid pass from a stream inlet 34 to a stream outlet 36 to transfer heat to or from the second medium 12. The method includes, as a first step 101, dividing the fluid circuits 14a, 14b, and 16 into at least two groups by identifying at least one group 13a of the fluid circuits that perform similarly according to a selected performance criterion or selected criteria. A second step 102 may include providing a respective valve 30 for at least the identified group 13a, which valve 30 is in fluid communication with all the streams of the associated group 13a so as to be able to control the flow of fluid through the streams of the associated group 13a in parallel. A third step 103, which may be performed before the second step 102 (see FIG. 3), may include providing a respective sensor 26 for at least the identified group 13a, which sensor 26 generates a signal representative of a parameter of the first fluid in the associated group 13a. A fourth step 104 includes operating each respective valve 30 based at least in part upon the signal generated by the associated sensor 26 to separately control the flow of the first fluid though the associated group 13a.

Figure 3:
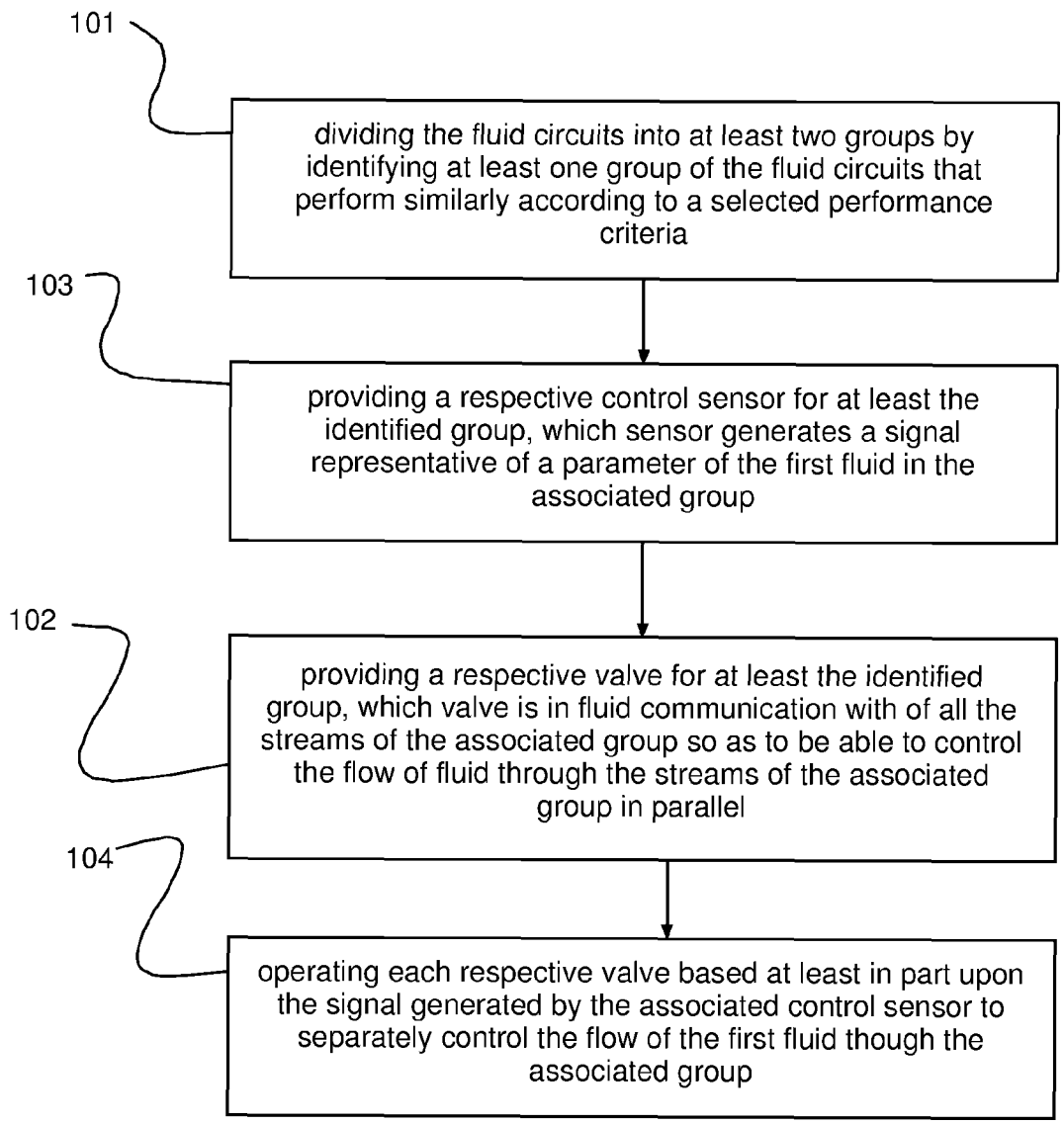
FIG. 3 is a view similar to that of FIG. 2, illustrating how steps may be re-ordered.

FIG. 3 is the same as FIG. 2, except showing that the step reversing the order of the step of providing a respective valve 30 for at least the identified group 13a, and the step of providing a respective control sensor 26 for at least the identified group 13a. More specifically, the method includes, as a first step 111, dividing the fluid circuits 14a, 14b, and 16 into at least two groups by identifying at least one group 13a of the fluid circuits that perform similarly according to a selected performance criterion or selected criteria. A second step 112 may include providing a respective valve 30 for at least the identified group 13a, which valve 30 is in fluid communication with of all the streams of the associated group 13a so as to be able to control the flow of fluid through the streams of the associated group 13a in parallel. A third step 113, which may be performed before the second step 102 (see FIG. 3), may include providing a respective sensor 26 for at least the identified group 13a, which sensor 26 generates a signal representative of a parameter of the first fluid in the associated group 13a. A fourth step 114 includes operating each respective valve 30 based at least in part upon the signal generated by the associated sensor 26 to separately control the flow of the first fluid though the associated group 13a. The steps of providing a valve and a sensor are not order sensitive, and indeed, installation of the valve(s) and sensor(s) may occur simultaneously (not shown), and the scope of any claim hereof reciting installation of valve(s) and sensor(s) should be interpreted to include the reverse order of installation of valve(s) and sensor(s) from that stated, and interpreted to include simultaneous installation of valve(s) and sensor(s).

Figure 4:
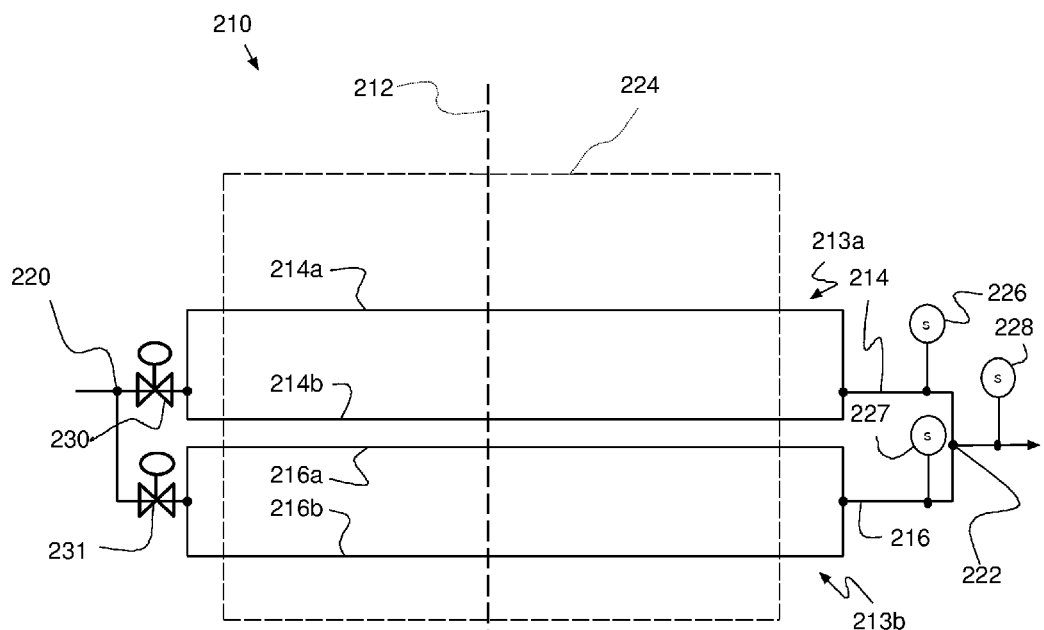
FIG. 4 is a schematic illustration of a second embodiment of a heat exchanger.

FIG. 4 illustrates schematically a heat exchanger, indicated generally at 210. The heat exchanger 210 may provide for relatively efficient heat transfer from one medium to another medium within a heat exchange area, indicated by a dashed line 224. In the illustrated embodiment, one medium is a first fluid. At a common inlet point 220, the flow of the first fluid may be divided into multiple flow streams, which may be contained within four fluid conduits 214a, 214b, 216a and 216b to pass through the heat exchanger 210. The multiple flow streams of the first fluid may then be recombined at a common outlet point 222. The second medium may be a second fluid, which may be contained within a fluid conduit 212. The second fluid contained in the fluid conduit 212 does not mix with the first fluid, as the first fluid is contained by the solid walls defining the fluid conduits 14a, 14b, 16a, and 16b.

For the purposes of illustration, assume the heat exchanger 210 is an evaporator for an air conditioning system, the first fluid is a refrigerant which undergoes a liquid to gas phase exchange in the heat exchanger 210 as the first fluid absorbs heat from the second fluid, and the second fluid is air to be cooled in the heat exchanger 210. In this exemplary arrangement, the fluid conduit 212 may be an air conditioning duct, within which an evaporator coil, formed by the fluid conduits 14a, 14b, 16a, and 16b, is disposed.

As is typical, the evaporator coil may be provided with features to enhance heat transfer from the second fluid to the first fluid and evaporate the first fluid, such that substantially all (i.e., greater than about 90%) of the heat transfer to the first fluid from the second fluid occurs within the heat exchange area 224, which is the area provided with such features. For example, in a tube and fin heat exchanger, the features may be metallic fins fixed to the fluid conduits 14a, 14b, 16a, and 16b to increase heat transfer area to enable more efficient heat transfer between the first fluid and the second fluid.

The fluid conduits 214a, 214b, 216a, and 216b are divided into two groups, a first group, indicated generally at 213a, consisting of the fluid conduits 214a and 214b, and a second group, indicated generally at 213b, consisting of the fluid conduits 216a and 216b. The fluid conduits 214a and 214b may be determined to perform similarly within the heat exchanger 210 according to a selected performance criterion or selected criteria. The fluid conduits 216a and 216b may be determined to perform differently than the fluid conduits 214a and 214b according to the selected performance criterion or criteria. The determination of similar performance may be made predictively, based upon the design of the heat exchanger 210 and anticipated operating conditions, or may be made based upon actual measurements of the heat exchanger 210 during actual operating conditions, or a combination of actual measurements and prediction.

For example, during the design of a new air conditioning system, the performance of the various fluid paths through the evaporator may be computer modeled, and the shape and number of fluid flow paths (tubes of a tube and fin heat exchanger type evaporator) may be optimized according to several, often competing, objectives (efficiency of heat transfer, cost, pressure loss of fluids passing through the insides of the tubes and passing around the outside of the tubes, etc.). Generally, it is unlikely that the flow paths can be optimized such that all flow paths have the same performance. For example, space considerations may result in the duct 212 being arranged in a manner that flow of the second fluid is not evenly distributed across the fluid conduits 214a, 214b, 216a, and 216b. It may be that a portion of the flow of the second fluid is such that each of the 214a and 214b in the first group 213a have similar operating conditions and perform similarly. A second portion of the flow of the second fluid, having different properties than the first portion of the flow of the second fluid, such as locally different flow rates, may affect only the fluid conduits 216a and 216b, so that the conduits 216a and 216b of the second group 213b experience mutually similar operating conditions, which are different than the operating conditions experienced by the fluid conduits 214a and 214b of the first group 213a. For this reason of non-uniform flow of the second fluid through the heat exchanger 210, the fluid conduits 216a and 216b of the second group 213b may perform mutually similarly, but may perform differently than the fluid conduits 214a and 214b in the first group 213a. Of course, many other factors may account for non-uniform performance of the fluid conduits 214a, 214b, 216a, and 216b other than non-uniform flow of the second fluid.

As indicated, the fluid conduits 214a, 214b, 216a, and 216b may not perform uniformly due to design choices made in light of various design criteria while designing the heat exchanger 210. As another example, the heat exchanger 210 could be a universal replacement evaporator coil designed to be installed in a number of different air conditioning units as a replacement for a damaged original evaporator coil. In such case, the design choices made in designing the heat exchanger 210 may be different than design choices that may be made when designing an evaporator coil for a specific installation. However, measurements of a selected performance criterion or selected criteria, such as those listed above in the description of the first embodiment shown in FIG. 1, may be made in the field, and conduits may be grouped or may be based on measured similarity of performance.

As indicated above, in the embodiment illustrated in FIG. 4, the fluid conduits 214a and 214b perform similarly, and are in the first group 213a. A sensor 226 is provided at a location where the sensor 226 can monitor a parameter of the first fluid which is related to the performance of the fluid conduits in the first group 213a, such as in a conduit 214 carrying the combined streams of the first fluid coming out of the fluid conduits 214a and 214b. Similarly, a sensor 227 is provided at a location where the sensor 227 can monitor a parameter of the first fluid which is related to the performance of the fluid conduits in the second group 213b, such as in a conduit 216 carrying the combined streams of the first fluid coming out of the fluid conduits 216a and 216b.

The sensors 226 and 227 may, for example, be thermometers sensing the temperature of the fluid in the associated conduits 214 and 216, respectively. Pressure of the first fluid in the region of the sensors 226 and 227 may be determined to be substantially the same as that at the common outlet point 222 where all the streams of the first fluid going through the heat exchanger 210 are recombined. A sensor 228, which is a pressure sensor, may be provided to measure pressure at the common outlet point 222, and thus pressure at the sensors 226 and 227. Knowledge of the temperature and pressure of the refrigerant that is the first fluid in the conduit 214 may enable calculation of the number of degrees of superheat of the refrigerant, which is a measure of how far the gaseous refrigerant at the outlet of the evaporator is from containing liquid. Similarly, the pressure reading of the sensor 228 and the temperature reading of the sensor 227 may allow determination of the number of degrees of superheat of the first fluid in the fluid conduit 216.

In many installations, it would be undesirable to have liquid refrigerant exiting an evaporator, due to the effects on a compressor (not shown) which would be downstream from the evaporator in a typical air conditioning system (as described in the Background section, above). On the other hand, excessive amounts of superheat may also be undesirable because this condition is inefficient. Accordingly, the first fluid having desired amount of superheat at the outlet of the evaporator may be chosen to indicate optimal performance of the fluid conduits 214a, 214b, 216a, and 216b.

A valve 230 may be provided to control the streams of the first fluid passing through the fluid conduits 214a and 214b of the first group 213a. The valve 230 may be controlled to regulate the first fluid to have a desired amount of superheat in the conduit 214. Because the fluid conduits 214a and 214b perform similarly, the first fluid should have similar values of superheat at the outlet of each of the fluid conduits 214a and 214b, which should be similar to that seen in the conduit 214.

However, if the fluid conduits 216a and 216b were connected to be fed from the valve 230, the first fluid would not have these same similar values of superheat, since the fluid conduits 216a and 216b of the second group 213b perform differently than the fluid conduits 214a and 214b. The performance of the fluid conduits 216a and 216b in such a situation might be non-optimal. Therefore, a second valve 231 is provided to control the streams of the first fluid passing through the fluid conduits 216a and 216b of the second group 213b. The valve 231 may be similarly controlled to regulate the first fluid to have, for example, the target two degrees of superheat in the conduit 216. Because the fluid conduits 216a and 216b perform similarly, the first fluid should have similar values of superheat at the outlet of each of the fluid conduits 216a and 216b, which should be similar to that seen in the conduit 216, as monitored by the sensors 227 and 228.

Thus, the performance of the conduits in the first group 213a and the conduits 213b can be optimized by actively controlling similarly performing fluid conduits as groups.

While any suitable valve may be utilized, it may be desirable to utilize MEMS devices as the valves 20, 230, and 231, described above. Micro ElectroMechanical Systems (MEMS) relate in general to semiconductor electromechanical devices. MEMS is a class of systems that are physically small, having features with sizes in the micrometer range or smaller. A MEMS device is a device that at least in part forms part of such a system. These systems have both electrical and mechanical components. The term "micromachining" is commonly understood to mean the production of three-dimensional structures and moving parts of MEMS devices. MEMS originally used modified integrated circuit (computer chip) fabrication techniques (such as chemical etching) and materials (such as silicon semiconductor material) to micromachine these very small mechanical devices. Today there are many more micromachining techniques and materials available. The term "microvalve," as used in this disclosure, means a valve having features with sizes in the micrometer range or smaller, and thus by definition is at least partially formed by micromachining. The term "microvalve device," as used in this application, means a device that includes a microvalve, and that may include other components. It should be noted that if components other than a microvalve are included in the microvalve device, these other components may be micromachined components or standard sized (larger) components.

In particular, one MEMS device that may be suitable for use as an expansion valve in many installations is the Microstaq SEV™ (Silicon Expansion Valve) microvalve available from the assignee hereof, Microstaq, Inc., of Austin, Tex. The Microstaq SEV™ microvalve device is a silicon MEMS-based fluid control device which is able to control relatively large fluid flow rates compared to other MEMS-based valves. U.S. patent application Ser. Nos. 08/004,132; 61/097,635; and 61/120,412; PCT publication WO/2008/121369; and U.S. Pat. Nos. 6,540,203; and 6,694,998, the disclosures of which are incorporated herein by reference, all disclose microvalves and/or micromachined devices that may also be suitable in certain applications.

The previous technology utilizing mechanical control of expansion valves is many decades old technology. Because of a lack of precision and responsiveness, such technology may cause an evaporator of an HVACR system to operate over a large superheat range, which may significantly lower the heat exchange efficiency of the evaporator. Relatively small changes in ambient conditions can cause an evaporator with mechanical controls to deviate from its designed performance range, which translates directly to much higher energy usage due to the loss of efficiency of the evaporator. MEMS based technology allows the packaging of multiple microvalve devices into a compact, relatively low cost package that may dynamically respond to rapidly changing system conditions by precisely metering refrigerant into the evaporator (or precisely controlling the flow of a fluid through individual flow conduits of other types of heat exchangers), significantly simplifying HVAC system design, and improving heat exchanger efficiency through tighter control of operating conditions. By doing so, the use of such a microvalve device may significantly lower energy usage. Such a package may further include sensors, microprocessors, etc. Additionally, grouping of similarly performing flow conduits, and then controlling each group of similarly performing flow conduits with a single respective microvalve device provides an opportunity for further cost reductions. Such microvalve devices may or may not be integrated into a single package.

Figure 5:
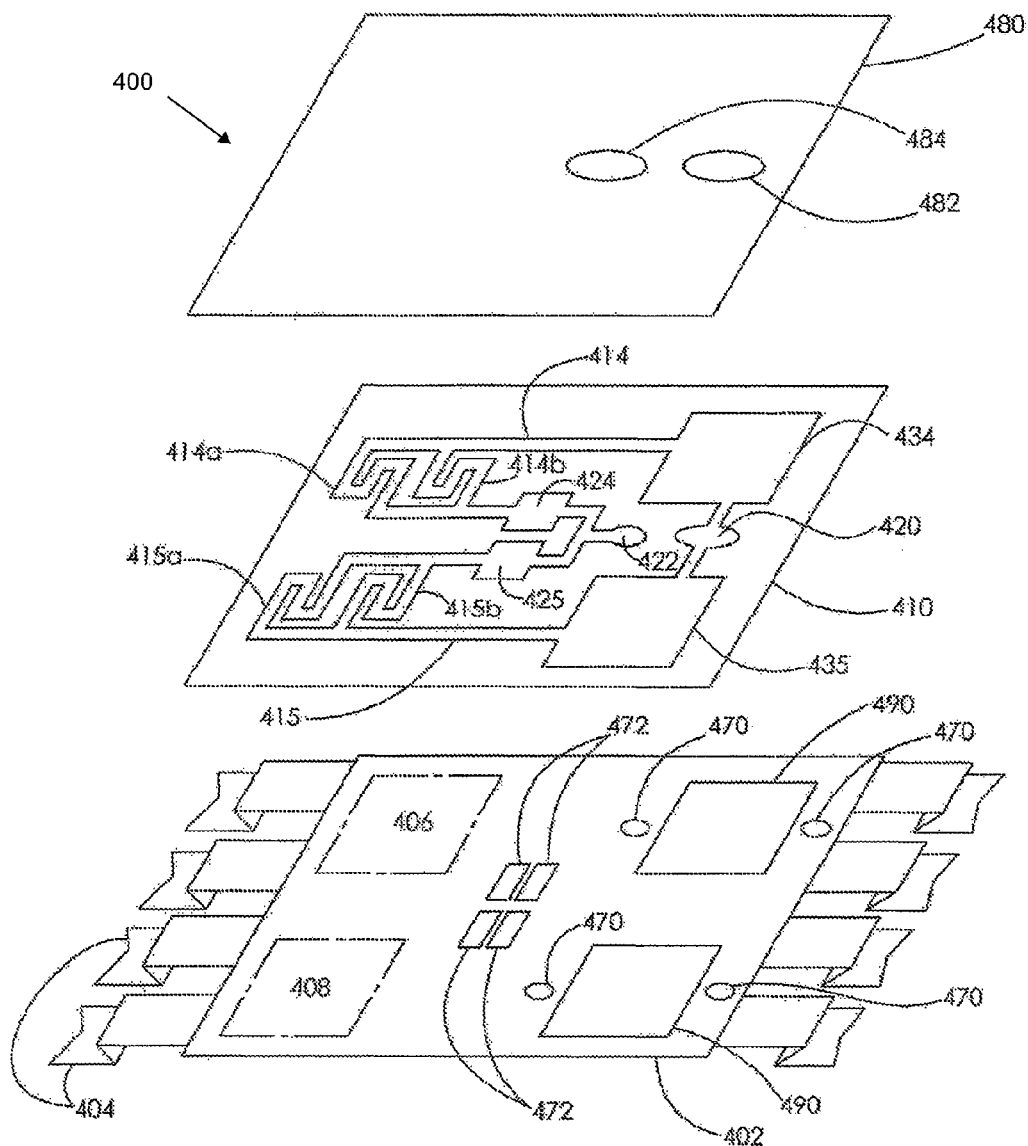
FIG. 5 is an exploded view of a microvalve device in accordance with the invention.

Referring now to FIG. 5, it may be seen that the use of a microvalve device may be seen to not be limited to control of the flow through conventional (macro-sized) heat exchangers. A representative microvalve device is indicated generally at 400. The microvalve device 400 may include a semiconductor integrated circuit or other miniaturized electronic device 402. The device 402 forms a layer of the microvalve device 400. The device 402 may be provided with a plurality of pins or leads 404. For the sake of example, it is assumed that the device 402 heats during use, and heats unevenly, such that an upper left portion (as viewed in FIG. 5), indicated at 406, and a lower left portion, indicated at 408, are subject to more heating than the right portion (as viewed in FIG. 5). Furthermore, assume that the heating experienced in the portions 406 and 408 is not constant, that heat is generated generally uniformly in the portion 406, that heat is generated generally uniformly in the portion 408, and the amount of heat generated in the portion 406 is significantly different than the amount of heat generated in the portion 408. Excessive heat can damage semiconductor devices.

Accordingly, a micromachined heat exchanger structure in the form of a cooling layer 410 may be provided for the microvalve device 400. The cooling layer 410 may be bonded, or otherwise suitably secured to, the device 402. The cooling layer 410 may be formed from a single piece of silicon semiconductor material or other suitable material. The cooling layer 410 may include a plurality of fluid conduits defined therein. In the illustrated example, the cooling layer 410 has a first fluid conduit 414 and a second fluid conduit 415 formed therein. The fluid conduits 414 may be formed in part, for example, by etching a first fluid circuit 414a and a second fluid circuit 414b as grooves in one side of the cooling layer 410, such that the first fluid circuit 414a and the second fluid circuit 414b form parallel flow paths. Similarly, the fluid conduits 415 may be formed in part, for example, by etching a first fluid circuit 415a and a second fluid circuit 415b as grooves in one side of the cooling layer 410, such that the first fluid circuit 415a and the second fluid circuit 415b form parallel flow paths. An inlet portion of each of the fluid conduits 414 and 415 communicates with a first common point 420. An outlet portion of each of the fluid conduits 414 and 415 communicates with a second common point 422. A fluid travels from the first common point 420, through the two fluid conduits 414 and 415, to the second common point 422. Preferably, the fluid is a dielectric fluid which does not significantly conduct electricity, and which would not substantially chemically or otherwise damage electronic or other components in the event of leakage.

Each of the fluid circuits 414a and 414b may describe a labyrinth path adjacent to part of the heated portion 406 in the device 402, in order to maximize the heat transfer areas thereof, so as to achieve good heat transfer between the heated portion 406 and the fluid in the fluid conduits 414. Similarly, each of the fluid circuits 415a and 415b may describe a labyrinth path adjacent to part of the heated portion 408 in the device 402, in order to maximize the heat transfer areas thereof, so as to achieve good heat transfer between the heated portion 408 and the fluid in the fluid conduits 414.

If the fluid circuits 414a and 414b are of the same length, width, and depth, because the heat generation is generally uniform in the area 406, it may be predicted that the performance of the fluid circuits 414a and 414b will be similar, and the temperature rise of fluid flowing through each of the fluid circuits 414a and 414b will be similar. Therefore, as will be discussed below, the fluid circuits 414a and 414b are grouped together for control, that is plumbed to be controlled in common. Similarly, if the fluid circuits 414a and 414b are of the same length, width, and depth, because the heat generation is generally uniform in the area 408, it may be predicted that the performance of the fluid circuits 415a and 415b will be similar, and the temperature rise of fluid flowing through each of the fluid circuits 415a and 415b will be similar. Therefore, as will be discussed below, the fluid circuits 415a and 415b are grouped together for control, that is plumbed to be controlled in common.

Of course, the fluid circuits 415a and 415b (or the fluid circuits 414a and 414b) could be other than of uniform length, width, and depth, and still be predicted to perform similarly, depending upon the exact heat transfer properties of the specific arrangements.

In order to determine the current performance of each of the fluid conduits 414 and 415, a sensor may be provided in each of the fluid conduits 414 and 415 to generate a respective signal representative of a value of a selected parameter of the fluid at the location of the respective sensor. Any suitable sensor may be provided; accordingly the sensors are indicated in FIG. 8 as featureless boxes. More specifically, a first sensor 424 may be provided at a location where the first sensor 424 can monitor a parameter of the first fluid which is related to the performance of the first fluid conduit 414; and a second sensor 425 may be provided at a location where the second sensor 425 can monitor a parameter of the first fluid which is related to the performance of the associated second fluid conduit 415. In the illustrated embodiment, the sensors 424 and 425 are each located at the outlet portion of the respective fluid conduit 414 and 415. Advantageously, the sensors 424 and 425 may be semiconductor devices fabricated integrally with the cooling layer 410, for example, micromachined temperature sensors, pressure sensors, or flow sensors, etc.

In order to control the flow of fluid through the fluid conduits 414 and 415, a respective microvalve may be provided in each of the fluid conduits 414 and 415. More specifically, a first microvalve 434 may be provided in the first fluid conduit 414 to simultaneously control the flow of fluid through the fluid circuits 414a and 414b; and a second microvalve 435 may be provided in the second fluid conduit 415 to simultaneously control the flow of fluid through the fluid circuits 415a and 415b. In the illustrated embodiment, the microvalves 434 and 435 are each located at the inlet portion of the respective fluid conduit 414 and 415. Advantageously, the microvalves 434 and 435 may be semiconductor devices fabricated integrally with the cooling layer 410. The microvalves 434 and 435 may be of any type suitable for the particular application; accordingly, they are represented by featureless boxes in FIG. 8. For example, the microvalves 434 and 435 may be direct acting microvalves or pilot operated microvalves, such as those discussed in U.S. patent application Ser. Nos. 08/004,132; 61/097,635; and 61/120,412; PCT publication WO/2008/121369; and U.S. Pat. Nos. 6,540,203; and 6,694,998; the disclosures of which are incorporated herein by reference. The microvalves 434 and 435 may be operated at least in part based upon signals generated by the associated sensors 424 and 425.

Electrical connections to power the microvalves 434 and 435, and the sensors 424 and 425 may be through the device 402. Electrically conductive pads 470 may be provided on the device 402, to which portions of the cooling layer 410 may bond to conduct electrical power from the device 402 to the microvalves 434 and 435. Similarly, electrically conductive pads 472 may be provided on the cooling layer which may supply electrical power to, and may conduct an electrical signal from, the sensors 424 and 425.

A cover layer 480 may be provided that is bonded or otherwise suitably attached to the cooling layer 410. The cover layer 480 may cooperate with the walls of the passageways etched in the cooling layer 410 to create a leak-proof boundary defining the fluid conduits 414 and 415. The cover layer 480 may define two apertures 482 and 484 therethrough. The aperture 482 may be in fluid communication with the first common point 420 of the cooling layer 410. Similarly, the aperture 484 may be in fluid communication with the second common point 422 of the cooling layer 410. The aperture 482 may thus provide fluid communication between an external fluid supply line (not shown) and the inlet portions of both of the fluid conduits 414 and 415 to supply cooling fluid to the cooling layer 410, while the aperture 484 may thus provide fluid communication between an external fluid return line (not shown) and the inlet portions of both of the fluid conduits 414 and 415. The external fluid supply line and external fluid return line may be fixed in communication with the apertures 483 and 484, respectively, by any suitable method. Recesses 490 may be provided in the surfaces of the device 402 and the surface (not shown) of the cover layer 480 that are adjacent the cooling layer 410. The cover layer 480 and the device 402 may not be bonded to the cooling layer 410 in the region of the recesses 490. The recesses 490 may be provided in the areas adjacent moving parts of the microvalves 434 and 435 so as to not cause friction when the moveable portions of the microvalves 434 and 435 are moving during operation.

In operation, the microvalves 434 and 435 are operated to dynamically control the flow of fluid through the respective fluid conduit 414 and 415 to achieve a desired set point for a parameter, such as temperature, at the associated sensors 424 and 425. It is expected that heat from the device 402 would be transferred into the fluid in the fluid conduits 414 and 415 at any point along the length of the fluid conduits 414 and 415, from the first common point 420 to the second common point 422, allowing the cooling layer 410 to cool the whole device 402. However, if the device 402 changed operating states, for example, operating so as to generate more heat in the portion 406, then the sensor 424 (in this example) would note the increased heating of the fluid in the first fluid conduit 414 that is routed adjacent to the portion 406. The signal generated by the sensor may be, for example, sent to a control unit (not shown) forming a portion of the device 402. Alternatively, the control unit might be built into the cooling layer 410 (not shown), or any other suitable location. The control unit may respond to this signal by opening the microvalve 434. In this manner, operation of the cooling layer (heat exchanger) 410 can be optimized, utilizing only as much fluid flow as is required to keep the fluid parameter at the desired set point, and not wasting energy by providing (pumping) more fluid flow than is required, or, of course, supplying insufficient fluid flow, so that the device 402 overheats and is damaged.

Indeed, one of many advantages that may be realized is a relatively tight control of the cooling provided by the cooling layer 410 (or the heat transfer provided by the heat exchangers 10 or 210) while optimizing the efficiency of such heat exchangers. Indeed, it is anticipated that, operating as an evaporator, a heat exchanger arranged similarly to those described herein may be controlled to maintain, for example, superheat within four degrees centigrade of a desired setpoint; it is anticipated that a heat exchanger optimized as described herein, utilizing microvalve devices for control may be able to control superheat within 2 degrees centigrade of a desired setpoint.

As noted that above, the microvalves 434 and 435 may be semiconductor devices (microvalve devices) fabricated integrally with the cooling layer 410, that is, in a single package. Furthermore, as illustrated in FIG. 5, this single package may further include the micromachined heat exchanger, and may further include one or both of the first and second micromachined sensors, to achieve a compact package which can realize the cost savings associated with utilizing manufacturing processes similar to those utilized in the semiconductor industry. Indeed, the single package may further include the integrated circuit device 402; although the microvalve device 400 is shown as a three dimensional integrated circuit, that is, having two (the device 402 and the cooling layer 410) or more layers of active electronic components integrated into a single integrated circuit device, it is contemplated that the cooling circuitry of the cooling layer 410 could be integrated into the device 402, so that a microvalve device with a single layer of active electronic components could be produced with optimized cooling.

The principle and mode of operation of this invention have been explained and illustrated in its preferred embodiment. However, it must be understood that this invention may be practiced otherwise than as specifically explained and illustrated without departing from its spirit or scope.

What is claimed is:

1. A micromachined device, comprising:
an integrated circuit including a portion which is heated during operation; and
a micromachined multi-circuit heat exchanger structure disposed for heat transfer between a fluid and the heated portion, including:
a plurality of micromachined fluid conduits into which a flow of the first fluid may be subdivided while flowing from a common inlet point to a common outlet point, the plurality of fluid conduits including at least a first group of two or more fluid conduits and a second group of fluid conduits, each of the fluid conduits within the first group performing generally similarly, the fluid conduits of the first group performing generally differently from the fluid conduits of the second group;
a first micromachined sensor generating a first signal representative of a parameter of the fluid in the first group of fluid conduits; and
a first microvalve device controlling flow of the fluid through the first group of fluid conduits based at least in part upon the first signal.

2. The micromachined device of claim 1, further including:
a second sensor generating a second signal representative of a parameter of the fluid, and
a fluid control device that comprises at least one of a valve, a pump, a flow restrictor, and a compressor that controls flow through at least the second group of fluid conduits based at least in part upon the second signal.

3. The micromachined device of claim 2, wherein the valve is a second microvalve device.

4. The micromachined device of claim 3, wherein the first microvalve device and the second microvalve device are disposed in a single package.

5. The micromachined device of claim 4, wherein the single package further includes the micromachined heat exchanger and the first and second micromachined sensors.

6. The micromachined device of claim 5, wherein the single package further includes the integrated circuit.

7. The micromachined device of claim 1, wherein the parameter is at least one of temperature, pressure, mass flow rate, volumetric flow rate, density, and energy content.

8. The micromachined device of claim 1, wherein each of the fluid conduits within the second group perform generally similarly.

* * * * *